United States Patent
Qiu et al.

(10) Patent No.: US 8,715,904 B2
(45) Date of Patent: May 6, 2014

(54) PHOTOCURABLE COMPOSITION

(75) Inventors: Zai-Ming Qiu, Woodbury, MN (US); Douglas C. Fall, St. Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 129 days.

(21) Appl. No.: 13/457,657

(22) Filed: Apr. 27, 2012

(65) Prior Publication Data

US 2013/0288162 A1    Oct. 31, 2013

(51) Int. Cl.
*G03F 7/004*    (2006.01)

(52) U.S. Cl.
USPC ............ 430/270.1; 430/280.1; 430/913; 430/927; 430/330

(58) Field of Classification Search
USPC ............ 430/270.1, 330, 927, 913, 280.1
IPC ............ G03F 7/004, 7/0046, 7/0045
See application file for complete search history.

(56) References Cited

U.S. PATENT DOCUMENTS

| | | | |
|---|---|---|---|
| 2,716,102 A | 8/1955 | Unruh | |
| 2,940,853 A | 6/1960 | Sagura | |
| 3,046,110 A | 7/1962 | Schmidt | |
| 3,046,112 A | 7/1962 | Schmidt | |
| 3,046,119 A | 7/1962 | Sus | |
| 3,046,121 A | 7/1962 | Schmidt | |
| 3,106,465 A | 10/1963 | Neugebauer | |
| 3,149,975 A | 9/1964 | Notley | |
| 3,869,292 A | 3/1975 | Peters | |
| 4,148,655 A | 4/1979 | Itoh | |
| 4,180,404 A | 12/1979 | Ohmura | |
| 4,377,631 A | 3/1983 | Toukhy | |
| 4,404,272 A | 9/1983 | Stahlhofen | |
| 4,477,529 A * | 10/1984 | Campbell | 428/412 |
| 4,588,670 A | 5/1986 | Kelly | |
| 4,596,763 A | 6/1986 | DiCarlo | |
| 4,888,269 A | 12/1989 | Sato | |
| 4,902,726 A | 2/1990 | Hayashi | |
| 5,009,982 A | 4/1991 | Kamayachi | |
| 5,055,378 A | 10/1991 | Miyamura | |
| 5,061,744 A | 10/1991 | Ogitani | |
| 5,506,279 A | 4/1996 | Babu | |
| 5,753,722 A | 5/1998 | Itokawa | |
| 5,770,347 A * | 6/1998 | Saitoh et al. | 430/280.1 |
| 5,773,485 A | 6/1998 | Bennett | |
| 5,902,836 A | 5/1999 | Bennett | |
| 5,948,514 A | 9/1999 | Komori | |
| 7,094,829 B2 | 8/2006 | Audenaert | |
| 7,601,228 B2 | 10/2009 | Nishina | |
| 8,476,398 B2 * | 7/2013 | Klun et al. | 528/69 |
| 2005/0137355 A1 | 6/2005 | Buckanin | |
| 2009/0163615 A1 | 6/2009 | Halahmi | |
| 2010/0048751 A1 | 2/2010 | Keary | |
| 2010/0048757 A1 | 2/2010 | Okada | |
| 2010/0310875 A1 | 12/2010 | Hao et al. | |
| 2011/0008733 A1 * | 1/2011 | Qiu et al. | 430/272.1 |
| 2011/0027702 A1 | 2/2011 | Qiu | |
| 2011/0065045 A1 | 3/2011 | Qiu | |
| 2012/0107732 A1 | 5/2012 | Qiu | |

FOREIGN PATENT DOCUMENTS

| | | |
|---|---|---|
| EP | 0 232 972 | 9/1993 |
| EP | 0 870 778 | 9/2006 |
| EP | 2 277 962 | 1/2011 |
| EP | 2 589 636 | 5/2013 |
| JP | 2011184517 | 9/2011 |
| TW | 201207034 | 2/2012 |
| WO | WO 2011/034845 | 3/2011 |
| WO | WO 2011/034847 | 3/2011 |
| WO | WO 2012/087661 | 6/2012 |

OTHER PUBLICATIONS

Machine translation of JP 2011-184517 (no date).*
U.S. Appl. No. 61/593,104, entitled "Films Including a Copolymer, Articles and Methods," filed Jan. 31, 2012.
U.S. Appl. No. 13/169,306, entitled "Addition-Fragmentation Agents," filed Jun. 27, 2011.
U.S. Appl. No. 13/370,767, entitled "Photocurable Composition," filed Feb. 10, 2012.
Moad, et al., "Chain Transfer Activity of ω-Unsaturated Methyl Methacrylate Oligomers," *Macromolecules*, vol. 29, Issue 24, pp. 7717-7726, 1996.
PCT International Search Report, PCT/US2013/034756, 4 pages.

* cited by examiner

*Primary Examiner* — Amanda C. Walke
(74) *Attorney, Agent, or Firm* — Kent S. Kokko

(57) ABSTRACT

A low surface energy photoresist composition is described that comprises a silicone-polyether block copolymer, wherein the silicone block comprises 35 wt. % or more of said copolymer. When compounded with a photoresist composition, the composition enables the release of a phototool from the photoresist layer.

27 Claims, No Drawings

PHOTOCURABLE COMPOSITION

BACKGROUND

In the printed circuit industry, photographic masks or stencils bearing a circuit pattern are known as phototools. Such a stencil, through which a photoresist can be exposed, provides an intricate complex image representing an electrical circuit. The image often consists of many fine lines and junctions spaced closely together. During its use to make printed circuit boards, the phototool is placed face down on a photoresist layer and a contact print is made by exposing the photoresist to light, typically UV light, through the phototool, followed by separation of the phototool from the exposed photoresist layer. In this way, a single phototool can be used to make multiple contact prints.

The continued use of the phototool can cause tiny scratches and abrasions on the phototool surface. The photoresists on which the phototool is placed are usually laminated on sheet copper (or other vapor-deposited copper substrates) and small burrs or rough edges of the copper sheet can cause scratches as the phototool is transferred from one photoresist to the next. The phototool is also frequently wiped with a soft cloth to make sure it is dust and lint free. Small particles of dirt can cause scratching as they are wiped across the phototool surface. Because of this general wear and tear on the phototool surfaced during normal use, the phototool must be frequently inspected to ensure line continuity. Depending upon the size and the intricacy of the phototool, such microscopic inspections can take 2 to 3 hours.

Ideally, the phototool must be cleanly removable from the exposed photoresist to minimize contamination of the phototool. Various means of protecting the phototool have been described.

Due to the fact that phototools are vulnerable to scratching and that abrasion is a serious problem during the normal use of a phototool, protective films and overcoats having release performance are often employed to protect the phototool and allow repeated use of the phototool. For example, polysiloxane films coated with various kinds of pressure sensitive adhesives have been laminated to image-bearing surfaces of the phototool to protect the image and provide smooth release. Because of their thickness, however the laminating films can cause optical distortion. In addition, the polysiloxane films are relatively soft and thus provide only limited scratch protection.

Thinner and harder protective coatings can be obtained by coating the surfaces of phototools with liquid compositions. Then, the thin liquid coating is hardened to yield the desired protective coat with improved scratch resistance. Epoxy silanes and acrylate esters (for example, polyurethane acrylates) have been used as protective hard coatings because of their resistance to abrasion. Many of these protective overcoats have limited release properties, however, and can therefore stick to the surface of the photoresist even when additional slipping agents are used, particularly when sticky photoresist materials such as high viscosity solder mask inks are present.

U.S. 2011/008733 and U.S. 2011/027702 (Qiu et al.) describe a hardcoat composition to be applied to the phototool with reduced surface energy for improved durable release from photoresist that comprises (a) one or more epoxy silane compounds, (b) one or more epoxy-functionalized perfluoropolyether acrylate oligomers, and (c) photoacid generator. Applicant's copending application U.S. Ser. No. 61/549,138, filed 19 Oct. 2011, describes hardcoat compositions comprising (a) an epoxy silane compound, (b) a reactive silicone additive, and (c) photo-acid generator for phototool protection and release performance.

Alternative approach for easier release of phototool from photoresist for repeated use is having low surface energy photoresist, which can be achieved by using low surface energy additive in photoresist.

SUMMARY

In view of the foregoing, we recognize that there is a need for photoresist compositions that can be cured by exposure to actinic radiation, and that release easily from the phototool even when sticky materials such as high viscosity solder masks are present.

The present disclosure provides a low surface energy photoresist composition that comprises a (meth)acrylate copolymer having both pendent perfluoroether groups and pendent poly(alkylene oxide) groups. When compounded with a photoresist composition, the composition enable the manufacture of circuits by affixing a phototool on a photoresist layer, exposing the photoresist layer with the phototool to high intensity light, easily removing the phototool from the photoresist layer comprising the copolymer, and developing the light exposed photoresist under normal conditions for final product, such as printed circuit broad. The protective solder masks with low surface energy property may provide improved protection for printed circuit boards from moisture and liquid repellency.

"Alkyl" means a linear or branched, cyclic or acyclic, saturated monovalent hydrocarbon having from one to about 28, preferably one to 12, carbon atoms, e.g., methyl, ethyl, 1-propyl, 2-propyl, pentyl, and the like.

"Alkylene" means a linear saturated divalent hydrocarbon having from one to about twelve carbon atoms or a branched saturated divalent hydrocarbon radical having from three to about twelve carbon atoms, e.g., methylene, ethylene, propylene, 2-methylpropylene, pentylene, hexylene, and the like.

"Heteroalkyl" includes both straight-chained, branched, and cyclic alkyl groups with one or more heteroatoms independently selected from S, P, Si, O, and N with both unsubstituted and substituted alkyl groups. Unless otherwise indicated, the heteroalkyl groups typically contain from 1 to 20 carbon atoms. "Heteroalkyl" is a subset of "hydrocarbyl containing one or more S, N, O, P, or Si atoms" described below. Examples of "heteroalkyl" as used herein include, but are not limited to, methoxy, ethoxy, propoxy, 3,6-dioxaheptyl, 3-(trimethylsilyl)-propyl, 4-dimethylaminobutyl, and the like. Unless otherwise noted, heteroalkyl groups may be mono- or polyvalent, i.e. monovalent heteroalkyl or polyvalent heteroalkylene.

"Aryl" is an aromatic group containing 6-18 ring atoms and can contain optional fused rings, which may be saturated, unsaturated, or aromatic. Examples of an aryl groups include phenyl, naphthyl, biphenyl, phenanthryl, and anthracyl. Heteroaryl is an aryl containing 1-3 heteroatoms such as nitrogen, oxygen, or sulfur and can contain fused rings. Some examples of heteroaryl groups are pyridyl, furanyl, pyrrolyl, thienyl, thiazolyl, oxazolyl, imidazolyl, indolyl, benzofuranyl, and benzthiazolyl. Unless otherwise noted, aryl and heteroaryl groups may be mono- or polyvalent, i.e. monovalent aryl or polyvalent arylene.

"(Hetero)hydrocarbyl" is inclusive of hydrocarbyl alkyl and aryl groups, and heterohydrocarbyl heteroalkyl and heteroaryl groups, the later comprising one or more catenary oxygen heteroatoms such as ether or amino groups. Heterohydrocarbyl may optionally contain one or more catenary (in-chain) functional groups including ester, amide, urea, urethane, and carbonate functional groups. Unless otherwise indicated, the non-polymeric (hetero)hydrocarbyl groups typically contain from 1 to 60 carbon atoms. Some examples of such heterohydrocarbyls as used herein include, but are not limited to, methoxy, ethoxy, propoxy, 4-diphenylaminobutyl, 2-(2'-phenoxyethoxy)ethyl, 3,6-dioxaheptyl, 3,6-dioxahexyl-6-phenyl, in addition to those described for "alkyl", "heteroalkyl", "aryl", and "heteroaryl" supra.

"acryloyl" is inclusive of both esters and amides.

"(meth)acryloyl" includes both acryloyl and methacryloyl groups; i.e. is inclusive of both esters and amides.

DETAILED DESCRIPTION

The photoresist composition comprises a (meth)acryloyl copolymer having both pendent perfluoroether groups and pendent poly(alkylene oxide) groups. The copolymer may optionally further comprise pendent epoxy groups, pendent silane groups, pendent hydroxyl groups, pendent ester groups, and/or pendent photoinitiator groups.

More particularly, the copolymer may be of the formula:

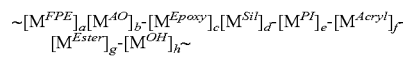

where

[$M^{FPE}$] represents interpolymerized (meth)acryloyl monomer units having a pendent perfluoropolyether group,

[$M^{AO}$] represents interpolymerized (meth)acryloyl monomer units having a pendent poly(alkylene oxide) group,

[$M^{Epoxy}$] represents interpolymerized (meth)acryloyl monomer units having a pendent epoxy group,

[$M^{Sil}$] represents interpolymerized (meth)acryloyl monomer units having a pendent silyl group,

[$M^{PI}$] represents interpolymerized (meth)acryloyl monomer units having a pendent photoinitiator group;

[$M^{Acryl}$] represents interpolymerized (meth)acryloyl monomer units having a pendent polymerizable (meth)acryloyl group;

-[$M^{OH}$]- represents interpolymerized (meth)acryloyl monomer units having a pendent hydroxy group, and subscripts a and b are each 1 to 100 and a+b is at least 3, c, d, e, f, g and h may be zero. In context, it will be appreciated that a particular monomer unit may refer to the starting monomers per se, or the interpolymerized monomer units of the copolymer.

The photocurable composition comprises 0.1 to 5 parts by weight of the copolymer relative to 100 parts by weight of the photoresist component. The average molecular weight, M, of the copolymer is from 1500 to 50,000.

The [$M^{FPE}$] monomer may be of the formula PFE-$X^2$—CO—C($R^1$)=$CH_2$, wherein PFE is a perfluorinated polyether group having a molecular weight of at least 792 g/mol, and $X^2$ is a (hetero)hydrocarbyl group and each $R^1$ is hydrogen or alkyl of 1 to 4 carbon atoms. More particularly, the perfluorinated polyether group is of the formula $R_f^1$—O—($R_f^2$)$_p$—($R_f^3$)$_q$—, wherein $R_f^1$ represents a perfluorinated alkyl group, $R_f^2$ represents a $C_1$-$C_4$ perfluorinated polyalkyleneoxy groups or a mixture thereof, $R_f^3$ represents a perfluorinated alkylene group, p is 3 to 25 and q is 0 to 1.

The perfluorinated alkyl group $R_f^1$ in the above formula may be linear or branched and may comprise 1 to 10 carbon atoms, preferably 1 to 6 carbon atoms. A typical perfluorinated alkyl group is $CF_3$—$CF_2$—$CF_2$—. $R_f^3$ is a linear or branched perfluorinated alkylene group that will typically have 1 to 6 carbon atoms. For example, $R_f^3$ is —$CF_2$— or —CF($CF_3$)—. Examples of perfluoroalkylene oxy groups of perfluorinated polyalkyleneoxy group $R_f^2$ include: —$CF_2CF_2O$—, —$CF(CF_3)CF_2O$—, —$CF_2CF(CF_3)O$—, —$CF_2CF_2CF_2O$—, —$CF(CF_3)O$—, and —$CF_2CF_2CF_2CF_2O$—. The perfluoroalkyleneoxy group may be comprised of the same perfluoroalkylene oxy units or of a mixture of different perfluoroalkyleneoxy units. When the perfluoroalkyleneoxy group is composed of different perfluoroalkyleneoxy units, they can be present in a random configuration, alternating configuration or they can be present as blocks.

Typical examples of perfluorinated polyalkyleneoxy groups include: —[$CF_2CF_2O$]$_y$—; —[CF($CF_3$)$CF_2O$]$_z$—; —[$CF_2CF_2O$]$_y$—[$CF_2O$]$_x$— and —[$CF_2CF_2O$]$_y$—[CF($CF_3$)$CF_2O$]$_z$—; wherein each of subscripts x, y and z are 3-25. A preferred perfluorinated polyether is $CF_3CF_2CF_2O$—[CF($CF_3$)$CF_2O$]$_z$—CF($CF_3$)— wherein z is an integer of 3 to 25. This perfluorinated polyether group has a lowest molecular weight of 792 when n equals 3 and can be derived from an oligomerization of hexafluoropropylene oxide. This perfluorinated polyether group is preferred because of its benign environmental properties. Higher molecular weights are preferred.

Thus, in a particular embodiment of the invention, the fluorinated polyether monomer corresponds to the formula: $R_f^1$—O—[CF($CF_3$)$CF_2O$]$_z$—CF($CF_3$)—$X^2$—CO—C$R^1$=$CH_2$, wherein $R_f^1$ represents a perfluorinated alkyl group, z is an integer of 3 to 25, $R^1$ represents hydrogen or an alkyl group of 1 to 4 carbon atoms, $X^2$ is a (hetero)hydrocarbyl group, preferably an alkyleneoxy group.

The (hetero)hydrocarbyl group $X^2$ may include groups such as —CONR$^1$—(CH$_2$)$_d$—$X^1$—, —COOCH$_2$CH(OH)CH$_2$—$X^1$—, —CONR$^1$—(CH$_2$)$_d$O—, —CH$_2$O—(CH$_2$)$_d$—$X^1$—, —CH$_2$O—(CH$_2$CH$_2$O)$_d$—CH$_2$CH$_2$—$X^1$—, and —CONR$^1$—(CH$_2$)$_d$O—CONH—C(Me)$_2$-C$_6$H$_4$-, where $X^1$ is —O— or —NR$^1$—, d is 2 to 10; $R^1$ is H or an alkyl group of 1 to 4 carbons.

Specific examples of fluorinated polyether monomers include:

PFE-CONR$^1$—(CH$_2$)$_j$—$X^1$—COC($R^1$)=$CH_2$, wherein and $X^1$ is —O— or —NR$^1$—, j is 2 to 10; $R^1$ is H or an alkyl group of 1 to 4 carbons;

PFE-COOCH$_2$CH(OH)CH$_2$—$X^1$—COC($R^1$)=$CH_2$, wherein $R^1$ is H or an alkyl group of 1 to 4 carbons and $X^1$ is —O— or —NR$^1$—;

PFE-CONR$^1$—(CH$_2$)$_j$O—CONHCH$_2$CH$_2$—$X^1$—CO—C($R^1$)=$CH_2$, wherein j is 2 to 10; $R^1$ is or an alkyl group of 1 to 4 carbons and $X^1$ is —O— or —NR$^1$—;

PFE-CH$_2$O—(CH$_2$)$_j$—$X^1$—CO—C($R^1$)=$CH_2$, wherein j is 2 to 10; $R^1$ is H, or an alkyl group of 1 to 4 carbons and $X^1$ is —O— or —NR$^1$—;

PFE-CH$_2$O—(CH$_2$CH$_2$O)$_j$—CH$_2$CH$_2$—$X^1$—CO—C($R^1$)=$CH_2$, wherein j is 2 to 10; $R^1$ is H, or an alkyl group of 1 to 4 carbons and $X^1$ is —O— or —NR$^1$—, and PFE-CH$_2$S—(CH$_2$)$_j$—$X^1$—CO—C($R^1$)=$CH_2$, wherein j is 2 to 10; $R^1$ is H, or an alkyl group of 1 to 4 carbons and $X^1$ is —O— or In the above exemplified compounds, PET has the meaning as defined above and is preferably $CF_3CF_2CF_2O$—(CF($CF_3$)$CF_2O$)$_c$CF($CF_3$)—, wherein subscript c is 3 to 25 The fluorinated polyether compounds can be readily obtained starting from, e.g., acid, ester or acid halide terminated perfluorinated polyether and reacting with an appropriate reactant to introduce the ethylenically unsaturated group and linking group $X^2$. These reactions are well-known to those skilled in the art and examples of suitable reactions and reactants to introduce the ethylenically unsaturated group and can be found for example in EP 870 778. For example, compounds of the formula H—$X^2$—C($R^1$)=$CH_2$ may be reacted with an acid, acid halide or ester terminated perfluorinated polyether. Alternatively a hydroxyl- or amino-terminated perfluorinated polyether may be reacted with an acryloyl compound having an electrophilic functional group.

The preparation of the [$M^{PFE}$] monomer may be illustrated as follows:
1) PFE-CO$_2$R+NH$_2$C$_2$H$_4$OH→PFE-C(O)NHC$_2$H$_4$OH→ PFE-C(O)NHC$_2$H$_4$OC(O)CR$^1$=CH$_2$
2) PFE-C(O)NHC$_2$H$_4$OH+IEM→PFE-C(O)NHC$_2$H$_4$OC(O)NHC$_2$H$_4$OC(C)CR$^1$=CH$_2$
3) PFE-CO$_2$R→PFE-CH$_2$OH→PFE-CH$_2$O—C(O)CR$^1$=CH$_2$
4) PFE-CH$_2$OH→PFE-CH$_2$O—CH$_2$CH$_2$OH→PFE-CH$_2$O—CH$_2$CH$_2$O—C(O)CR$^1$=CH$_2$ The [$M^{FPE}$] monomer is used in amounts of 5 to 60, preferably 20 to 40, parts by weight, relatively to 100 parts total monomers. The [$M^{PFE}$] may be added to enhance the hydrophobicity of the copolymer for low surface energy, and corresponding release performance, as well as moisture and liquid repellency.

The monomer [$M^{AO}$], can be represented by the general formula:

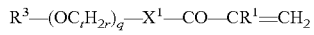

wherein
$R^3$ is H, a $C_1$-$C_4$ alkyl group;
r is from 2 to 4;
q is from 4 to 250; and
each $X^1$ is independently —O— or —NR$^1$—.

In some embodiments, r is preferably 2 or 3, or a mixture of at least one poly(ethylene oxide) ethylenically unsaturated monomer and at least one poly(propylene oxide) ethylenically unsaturated monomer. The poly(alkylene oxide) monomer typically has a molecular weight of at least 200 g/mole and typically no greater than about 5000 g/mole, and preferably less than about 3000 g/mole.

Representative poly(alkylene oxide) monomers include CH$_2$=CHCO$_2$(CH$_2$CH$_2$O)$_q$H, CH$_2$=CHCO$_2$(CH$_2$CH$_2$O)$_q$CH$_3$, CH$_2$=CMeCO$_2$(CH$_2$CH$_2$O)$_q$H, CH$_2$=CMeCO$_2$(CH$_2$CH$_2$O)$_q$CH$_3$, CH$_2$=CHCO$_2$(C$_3$H$_6$O)$_q$H, CH$_2$=CHCO$_2$(C$_3$H$_6$O)$_q$CH$_3$, CH$_2$=CMeCO$_2$(C$_3$H$_6$O)$_q$H, and CH$_2$=CMeCO$_2$(C$_3$H$_6$O)$_q$CH$_3$, where q is from 4 to 250.

It will be appreciated that when $R^1$ is —H, providing a terminal hydroxyl group, the resulting copolymer may be provided with pendent (meth)acryloyl groups in addition to the alkyleneoxy groups. Such pendent (meth)acryloyl groups are of the formula —OC(O)CR$^1$=CH$_2$ and are prepared by reaction by reaction with a (meth)acryloyl compound of the formula X$^3$—C(O)CR$^1$=CH$_2$ s shown in reaction equation below, wherein X$^3$ is —OH, Cl or F or an C1-C4 alkyl. Alternatively the hydroxyl terminus may be provided with a (meth)acryloyl group of the formula or —C(O)NHCH$_2$CH$_2$OC(O)CR$^1$=CH$_2$ by reaction with an isocyanate-functional (meth)acrylyl compound of the formula OCNCH$_2$CH$_2$OC(O)CR$^1$=CH$_2$.

Such monomers may be represent as [$M^{Acryl}$]$_f$, where [$M^{Acryl}$] represents interpolymerized (meth)acryloyl monomer units having a pendent (meth)acrylate groups and f is at least 1. All or a portion of the [$M^{AO}$] monomer units may be converted to [$M^{Acryl}$] monomer units. The [$M^{Acryl}$] monomer units may be used to crosslink the copolymer with the acrylate based photoresist during the photo-curing process.

The [$M^{AO}$] monomer is used in amounts of 5 to 80, preferably 5 to 60, parts by weight, based on 100 parts total monomer. The [$M^{AO}$] may be added to enhance to hydrophilicity of the copolymer and as wetting agent for improved coating quality. The [$M^{Acryl}$] monomer may be used in amounts of 5 to 80, preferably 5 to 60, parts by weight, based on 100 parts total monomer and may be used to crosslink the copolymer or for incorporation into an acrylate functional resist composition.

The copolymer optional includes epoxy monomers, [$M^{Epoxy}$] of the formula:

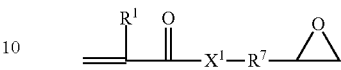

wherein:
$R^7$ is a (hetero)hydrocarbyl group, preferably a hydrocarbyl group, more preferably a $C_1$-$C_6$ alkylene;
$R^1$ is —H or $C_1$-$C_4$ alkyl; and
$X^1$ is —NR$^1$— or —O—.

Representative epoxy monomers include glycidyl (meth)acrylate, thioglycidyl (meth)acrylate, 3-(2,3-epoxypropoxy)phenyl (meth)acrylate, 2-[4-(2,3-epoxypropoxy)phenyl]-2-(4-(meth)acryloyloxy-phenyl)propane, 4-(2,3-epoxypropoxy)cyclohexyl (meth)acrylate, 2,3-epoxycyclohexyl (meth)acrylate, and 3,4-epoxycyclohexyl (meth)acrylate.

In one useful embodiment, the epoxy functional monomer is derived from the reaction of vinyldimethyl azlactone with a hydroxyalkyl epoxy compound as shown in the following Scheme 1:

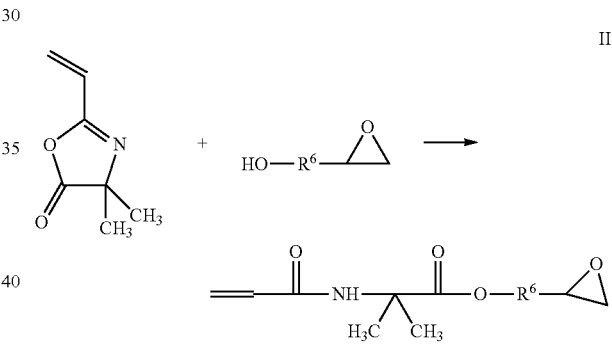

II where $R^6$ is a $C_1$-$C_6$ alkylene.

Such [$M^{Epoxy}$] monomers are used in amounts of 0 to 40, preferably 5 to 20, parts by weight, relative to 100 parts total monomers. Such epoxy functional monomers are desirably used in combination with epoxy-functional resist compositions.

The copolymer optionally contains silane monomers [$M^{Sil}$] including those with the following formula:

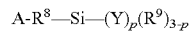

wherein:
A is an ethylenically unsaturated polymerizable group, including vinyl, allyl, vinyloxy, allyloxy, and (meth)acryloyl, preferably (meth)acrylate;
$R^8$ is a covalent bond or a divalent (hetero)hydrocarbyl group.

In one embodiment $R^8$ is a divalent hydrocarbon bridging group of about 1 to 20 carbon atoms, including alkylene and arylene and combinations thereof, optionally including in the backbone 1 to 5 moieties selected from the group consisting of —O—, —C(O)—, —S—, —SO$_2$— and —NR$^1$— groups (and combinations thereof such as —C(O)—O—), wherein $R^1$ is hydrogen, or a $C_1$-$C_4$ alkyl group. In another embodiment, $R^8$ is a poly(alkylene oxide) moiety of the formula —(OCH$_2$CH$_2$—)$_f$(OCH$_2$CH(R$^1$)$_g$—, where wherein f is at least 5, g may be 0, and preferably at least 1, and the mole ratio of f:g is at least 2:1 (preferably at least 3:1), and $R^1$ is H or a $C_1$-$C_4$ alkyl. Preferably, $R^8$ is a divalent alkylene, Y is a hydrolysable group, including alkoxy, acyloxy and halo;

$R^9$ is a monovalent alkyl or aryl group, p is 1, 2 or 3, preferably 3.

Useful silane monomers include, for example, 3-(methacryloyloxy) propyltrimethoxysilane, 3-acryloxypropyltrimethoxysilane, 3-acryloyloxypropyltriethoxysilane, 3-(methacryloyloxy)propyltriethoxysilane, 3-(methacryloyloxy)propylmethyldimethoxysilane, 3-(acryloyloxypropyl)methyldimethoxysilane, 3-(methacryloyloxy)propyldimethylethoxysilane, 3-(methacryloyloxy)propyldiethylethoxysilane, vinyldimethylethoxysilane, vinylmethyldiethoxysilane, vinyltriacetoxysilane, vinyltriethoxysilane, vinyltriisopropoxysilane, vinyltrimethoxysilane, vinyltriphenoxysilane, vinyltri-t-butoxysilane, vinyltris-isobutoxysilane, vinyltriisopropenoxysilane, vinyltris(2-methoxyethoxy)silane, and mixtures thereof.

The optional silane monomers [$M^{Sil}$] are used in amounts of 0 to 50, preferably 5-20, parts by weight, relative to 100 parts by weight total monomer. Such optional silane monomers are used as adhesion promoter for improved bonding to metal, to silaceous surfaces, to surfaces having —OH groups, or as a self-crosslinking group for the copolymer.

The copolymer optional comprises polymerized hydroxyl functional monomer units [$M^{OH}$] of the formula:

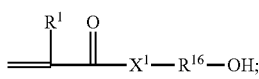

where $R^{16}$ is a (hetero)hydrocarbyl group, preferably a hydrocarbyl group, more preferably a $C_1$-$C_6$ alkylene;

$R^1$ is —H or $C_1$-$C_4$ alkyl; and $X^1$ is —$NR^1$— or —O—.

The hydroxyl-functional monomer is generally incorporated into the polymer to provide a pendent, reactive functional group that may be further functionalized to provide a pendent polymerizable (meth)acrylate groups, [$M^{Acryl}$], as described for the hydroxyl-functional [$M^{AO}$] monomers supra.

Useful hydroxyl functional monomers include hydroxyethyl (meth)acrylate, hydroxypropyl (meth)acrylate, 2-hydroxy-2-phenoxypropyl (meth)acrylate, and hydroxybutyl (meth)acrylate.

The terminal —OH may be reactive to epoxy based photoresist or can be converted into acrylate group (as described) for further cure with acrylate based photoresist for improved durability. The [$M^{OH}$] monomer may be used in amounts of 0 to 20 parts by weight, preferably 1-10 parts by weight, relative to 100 parts total monomer. All or a portion of the pendent hydroxyl groups may be converted to pendent (meth)acrylate groups as described for the [$M^{AO}$] monomers supra. Generally, at least 90% of the free hydroxyl groups are so converted. The remaining free hydroxyl groups may improve the hydrophilicity of the copolymer.

The optional (meth)acrylate ester monomer, [$M^{Ester}$], useful in preparing the oligomer is a monomeric (meth)acrylic ester of a non-tertiary alcohol, which alcohol contains from 1 to 20 carbon atoms and preferably an average of from 4 to 12 carbon atoms, optional with other functional groups.

Examples of monomers suitable for use as the acrylate ester monomer include the esters of either acrylic acid or methacrylic acid with non-tertiary alcohols such as ethanol, 1-propanol, 2-propanol, 1-butanol, 2-butanol, 1-pentanol, 2-pentanol, 3-pentanol, 2-methyl-1-butanol, 1-hexanol, 2-hexanol, 2-methyl-1-pentanol, 3-methyl-1-pentanol, 2-ethyl-1-butanol, 3,5,5-trimethyl-1-hexanol, 3-heptanol, 1-octanol, 2-octanol, isooctylalcohol, 2-ethyl-1-hexanol, 1-decanol, 1-dodecanol, 1-tridecanol, 1-tetradecanol, monoalkyl terminated polyethylene glycol and polypropylene glycol and the like. In some embodiments, the preferred acrylate ester monomer is the ester of acrylic acid with butyl alcohol or isooctyl alcohol, or a combination thereof, although combinations of two or more different acrylate ester monomer are suitable.

The optional ester monomers are used in amounts of 0 to 50, preferably 1-30, parts by weight, relative to 100 parts by weight total monomer. Such optional ester monomers are used to adjust the compatibility of the additive in photoresist formulation and adjust the $T_g$.

The photoinitiator monomers, [$M^{PI}$] include an acryloyl group and a photoinitiator group, which may be a hydrogen-abstracting type or an α-cleavage-type photoinitiator group, (Norrish Type I and II) and may be represented by the formula:

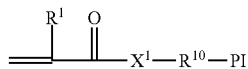

where;

$X^1$ is —O— or —$NR^1$, $R^1$ is independently H or $C_1$-$C_4$ alkyl;

$R^{10}$ is a divalent (hetero)hydrocarbyl linking group connecting the (meth)acryloyl group with the PI group; and PI is a photoinitiator which may represented by the structure:

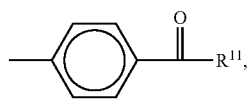

wherein $R^{11}$ is

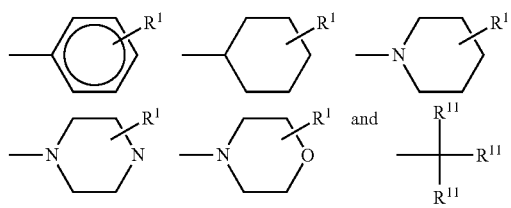

wherein $R^1$ is H or a $C_1$ to $C_4$ alkyl group, each $R^{11}$ is independently a hydroxyl group, a phenyl group, a $C_1$ to $C_6$ alkyl group, or a $C_1$ to $C_6$ alkoxy group. Such photoinitiator monomers are described, for example, in U.S. Pat. No. 5,902,836 (Babu et al.) and U.S. Pat. No. 5,506,279 (Babu et al.), the disclosures of which are herein incorporated by reference. Further details regarding the linking $R^{10}$ group may be found with reference to the cited references.

In certain embodiments, the photoinitiator group PI may be of the hydrogen-abstraction type represented by the general formula:

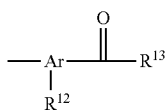

in which Ar is a substituted aryl having 6 to 12 carbon atoms, preferably a benzenetriyl group;
$R^{12}$ is hydrogen, a $C_1$ to $C_{12}$ alkyl group, a $C_1$ to $C_{12}$ alkoxy group, or a phenyl group; and
$R^{13}$ is a $C_1$ to $C_6$ alkyl group, a cycloalkyl group having 3 to 14 carbon atoms, or

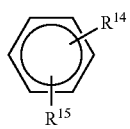

wherein $R^{14}$ and $R^{15}$ are independently selected from hydrogen, $C_1$ to $C_{12}$ alkyl groups, $C_1$ to $C_{12}$ alkoxy groups, and phenyl groups.

Included among those hydrogen abstracting photoinitiator groups are benzopheneone, anthraquinone, 5,12-naphthacenequinone, aceanthracenequinone, benz(A)anthracene-7,12-dione, 1,4-chrysenequinone, 6,13-pentacenequinone, 5,7,12,14-pentacenetetrone, 9-fluorenone, anthrone, xanthone, thioxanthone, acridone, dibenzosuberone, acetophenone, and chromone. The synthesis of such monomers monomers is described in U.S. Pat. No. 5,773,485 (Bennett et al), incorporated herein by reference.

The optional photoinitiator monomers are used in amounts of 0 to 5, preferably 0.5 to 5, parts by weight, relative to 100 parts by weight total monomer. Such optional photoinitiator monomers are used as initiators for acrylate based photoresist, and to free radically polymerize or crosslink the pendent (meth)acryloyl groups described in functionalizing the $[M^{AO}]$ and $[M^{OH}]$ monomers The copolymers may be prepared using conventional polymerization techniques known in the art, including solution, suspension or emulsion techniques, in the presence of a thermal—or photoinitiator. Conventional initiators can be employed in concentrations ranging from about 0.0001 to about 3.0 pbw, preferably from about 0.001 to about 1.0 pbw, and more preferably from about 0.005 to about 0.5 pbw, per 100 pbw of the total monomer.

The composition may be polymerized with either a thermal initiator or photoinitiator. Any conventional free radical initiator may be used to generate the initial radical. Examples of suitable thermal initiators include peroxides such as benzoyl peroxide, dibenzoyl peroxide, dilauryl peroxide, cyclohexane peroxide, methyl ethyl ketone peroxide, hydroperoxides, e.g., tert-butyl hydroperoxide and cumene hydroperoxide, dicyclohexyl peroxydicarbonate, bis(isobutyronitrile), and t-butyl perbenzoate. Examples of commercially available thermal initiators include initiators available from DuPont Specialty Chemical (Wilmington, Del.) under the VAZO trade designation including VAZO™ 67 (2,2'-azo-bis(2-methylbutyronitrile)) VAZO™ 64 (2,2'-azo-bis(isobtityronitrile)) and VAZO™ 52 (2,2'-azo-bis(2,2-dimethylaleronitrile)), and Lucidol™ 70 from Elf Atochem North America, Philadelphia, Pa.

Useful photoinitiators include benzoin ethers such as benzoin methyl ether and benzoin isopropyl ether; substituted acetophenones such as 2,2-dimethoxyacetophenone, available as Irgacure™ 651 photoinitiator (Ciba Specialty Chemicals), or as Esacure™ KB-1 photoinitiator (Sartomer Co.; West Chester, Pa.), and dimethoxyhydroxyacetophenone; substituted α-ketols such as 2-methyl-2-hydroxy propiophenone; aromatic sulfonyl chlorides such as 2-naphthalene-sulfonyl chloride; and photoactive oximes such as 1-phenyl-1,2-propanedione-2-(O-ethoxy-carbonyl)oxime.

If the optional $[M^{PI}]$ monomer is used, the copolymer is prepared using a thermal initiator. The polymerizations may be conducted in the presence of, or preferably in the absence of, suitable solvents such as ethyl acetate, toluene and tetrahydrofuran which are unreactive with the functional groups of the component (meth)acrylate co polymer(s).

If desired, a chain transfer agent may be added to the monomer mixture to produce a copolymer having the desired molecular weight. The chain transfer agent should be selected as to be non-reactive with the other components of the composition; i.e. will not add or condense with the other components. Generally, the average molecular weight, $M_w$, of the copolymer is from 1500 to 50,000.

Examples of useful chain transfer agents include but are not limited to those selected from the group consisting of carbon tetrabromide, alcohols, mercaptans, and mixtures thereof. A particularly useful class of non-reactive chain transfer agents includes the methacrylate dimers and trimers described in Moad, C. L.; Moad, G.; Rizzardo, E.; and Thang, S. H. *Macromolecules*, 1996, 29, 7717-7726, and in Applicant's copending application U.S. Ser. No. 13/169,306, incorporated herein by reference. When present, the preferred chain transfer agents are isooctylthioglycolate, the methacrylate dimers and trimers and carbon tetrabromide. The monomer mixture may further comprise up to about 5 parts by weight of a chain transfer agent, typically about 0.01 to about 5 parts by weight, if used, preferably about 0.5 parts by weight to about 3 parts by weight, based upon 100 parts by weight of the total monomer mixture.

Photoresist compositions are well known in the art of semiconductor lithography and are described in numerous publications including Deforest, Photoresist Materials and Processes, McGraw-Hill Book Company, New York, Chapter 2, 1975 and Moreau, Semiconductor Lithography, Principles, Practices and Materials, Plenum Press, New York, Chapters 2 and 4, 1988, incorporated herein by reference.

Useful photoresists can also include positive photoresists that include a polymer that becomes soluble in a basic developer upon exposure to radiation and negative photoresists that cross-link and become insoluble upon exposure to radiation. A variety of photo-sensitive polymers may be used in photoresists. Examples include, but are not limited to, copolymers of methyl methacrylate, ethyl acrylate and acrylic acid, copolymers of styrene and maleic anhydride isobutyl ester, and the like. The thickness of the photoresist is typically from about 1 μm to about 50 μm. The photoresist is then exposed to ultraviolet light or the like, through a mask or phototool, crosslinking the exposed portions of the resist. The unexposed portions of the photoresist are then developed with an appropriate solvent until desired patterns are obtained. For a negative photoresist, the exposed portions are crosslinked and the unexposed portions of the photoresist are then developed with an appropriate solvent. All photoresists using phototool for generating patterns in lithographic process requires the release of phototool from photoresists.

Exemplary negative photoresists include UVN 30 (available from Rohm and Haas Electronic Materials), and FUTURREX negative photoresists, such as NR9-1000P and NR9-3000PY (available from Futurrex, Franklin, N.J.).

Suitable positive-working photoresists typically contain two components, i.e., a light-sensitive compound and a film-forming polymer. The light-sensitive compound undergoes photochemical alteration upon exposure to radiation. Single component systems which employ polymers that undergo chain scission upon exposure to radiation are known. Light-sensitive compounds typically employed in two-component photoresist systems are esters formed from o-quinone diazide sulfonic acids, especially sulfonic acid esters of naphthoquinone diazides. These esters are well known in the art and are described in DeForest, supra, pages 47-55, and in Moreau, supra, pages 34-52. Light-sensitive compounds and methods used to make such compounds are disclosed in U.S. Pat. Nos. 3,046,110, 3,046,112, 3,046,119, 3,046,121, 3,106,465, 4,596,763 and 4,588,670, all incorporated herein by reference. Exemplary positive photoresists include UV5 photoresist and Shipley 1813 photoresist (both available from Rohm and Hass Electronic Materials, Marlborough, Mass.).

Polymers most frequently employed in combination with positive-working photoresists, e.g., o-quinone diazides, are the alkali soluble phenol formaldehyde resins known as the novolak resins. Photoresist compositions containing such polymers are described in U.S. Pat. Nos. 4,377,631 and 4,404,272. As disclosed in U.S. Pat. No. 3,869,292, another class of polymers utilized in combination with light-sensitive compounds is homopolymers and copolymers of vinyl phenol. The process of the instant invention is especially useful for the purification of positive-working photoresist compositions, such as the vinyl phenol-containing photoresist compositions.

Negative-working resist compositions can also be purified in accordance with the invention and are well known in the art. Such photoresist compositions typically undergo random crosslinking upon exposure to radiation thereby forming areas of differential solubility. Such resists often comprise a polymer and a photoinitiator. One class of negative-working photoresists comprises, for example, polyvinyl cinnamates as disclosed by R. F. Kelly, Proc. Second Kodak Semin. Micro Miniaturization, Kodak Publication P-89, 1966, p. 31. Other negative-working photoresists include polyvinyl-cinnamate acetates as disclosed in U.S. Pat. No. 2,716,102, azide cyclized rubber as disclosed in U.S. Pat. No. 2,940,853, polymethylmethacrylate/tetraacrylate as disclosed in U.S. Pat. No. 3,149,975, polyimide-methyl methacrylate as disclosed in U.S. Pat. No. 4,180,404 and polyvinyl phenol azide as disclosed in U.S. Pat. No. 4,148,655.

Another class of photoresists for purposes of the invention are those positive and negative acid-hardening resists disclosed in EP Application No. 0 232 972. These photoresists comprise an acid-hardening polymer and a halogenated, organic, photoacid generating compound.

A special photoresist is a solder resist which is used as permanent protective coating for printed wiring boards. Since the requirements of solder resist as a permanent insulating for moisture resistance, electrochemical migration resistance, thermal shock resistance, heat resistance and chemical resistance in addition to good hardness, adhesion and long shelf life, the composition normally includes both thermosetting and photosetting components and correspondingly may need severe setting conditions which results as one of the stickiest photoresist for phototool to release. Solder resists include those disclosed in U.S. Pat. No. 4,888,269 (Sato et al.), U.S. Pat. No. 4,902,726 (Hayashi et al.), U.S. Pat. No. 5,009,982 (Kamayachi et al.), U.S. Pat. No. 5,055,378 (Miyamura et al.), U.S. Pat. No. 5,061,744 (Ogitani et al.), U.S. Pat. No. 5,753,722 (Itokawa et al.), U.S. Pat. No. 5,948,514 (Komori et al.), and U.S. Pat. No. 7,601,228 (Nishina et al.) each incorporated herein by reference. Of particular interest are those photocurable and thermosetting compositions disclosed in U.S. Pat. No. 5,770,347 (Saitoh et al.), U.S. Pat. No. 5,753,722 (Itokawa et al.) and U.S. Pat. No. 5,948,514 (Komori et al.), which may be compounded with silicone-polyether block copolymer to produce a photoresist that is cleanly and easily removed from the phototool after irradiation. Solder resists are commercial available, such as from Taiyo Ink Mfg. Co. Lid.

If desired, the photocurable composition of the photoresist composition may further comprise a thermosetting resin, especially for solder masks to provide a tougher coating with better adhesion. The thermoset resin may comprise or more members selected from among amino resins, cyclocarbonate compounds, blocked isocyanates, and epoxy resins.

Useful amino resins include such methylated melamine resins as the products of Sanwa Chemicals Co., Ltd. marketed under trademark designations of NIKALAC MW-30, NIKALAC MW-30M, NIKALAC MW-22, NIKALAC MW-22A, NIKALAC MS-11, and NIKALAC MX-750 and the products of Mitsui-Cytec LTD, marketed under trademark designations of Cymel 300, Cymel 301, and Cymel 350; such mixed alkylated melamine resins as the products of Sanwa Chemicals Co., Ltd. marketed under trademark designations of NIKALAC MX-40 and NIKALAC MX-470 and the products of Mitsui-Cytec LTD, marketed under trademark designations of Cymel 238, Cymel 235, and Cymel 232; such imino group type melamine resins as the products of Mitsui-Cytec LTD, marketed under trademark designations of Cymel 325, Cymel 327, and Cymel XV-514; such benzoguanamine type amino resins as the products of Sanwa Chemicals Co., Ltd. marketed under trademark designations of NIKALAC BL-60 and NIKALAC BX-4000, such urea type amino resins as the products of Sanwa Chemicals Co., Ltd. marketed under trademark designations of NIKALAC MX-121 and NIKALAC MX-201; such melamine resins possessing an ethylenically unsaturated bond as the product of Sanwa Chemicals Co., Ltd. marketed under trademark designation of NIKALAC MX-302, and reaction products of these amino resins with N-methylol (meth)acrylamide, for example. In these amino resins, the average amount of formaldehyde bound to each of the active hydrogen atoms of the amino group ($-NH_2$) is properly not less than 65%, preferably not less than 80%. If this average amount is less than 65%, the developability of the composition will be unduly low because of the self-condensation of a given amino resin. The average degree of alkylation effected on a methylol group formed by the reaction of an amino group with formaldehyde is properly not less than 70%, preferably not less than 90%. If this average degree of alkylation is less than 70%, no good developability of the coating film will be attained because a curing reaction tends to proceed and a thermal fogging tends to occur during the step of drying. The amino resins which satisfy the requirements mentioned above, possess numerous points of crosslinking, and impart more perfect properties to the coating film include NIKALAC MW-30, NIKALAC MW-30M, NIKALAC MW-22. NIKALAC MW-22A, NIKALAC MX-40, NIKALAC MX-301, Cymel 300, Cymel 301, and the reaction products of melamine resins as with N-methylol (meth)acryl amide, for example.

The compounds which are obtained by the reaction of carbon dioxide gas upon epoxy resins are included among the aforementioned cyclocarbonate compounds. The epoxy resins mentioned above include such well-known epoxy compounds as glycidyl ethers of the bisphenol A type, hydrogenated bisphenol A type, bisphenol F type, bisphenol S type, phenol novolak type, cresol novolak type, bisphenol A-based novolak type, biphenol type, and bixylenol type; triglycidyl isocyanurate; and glycidyl amines such as N,N,N',N'-tetraglycidyl methaxylene diamine and N,N,N',N'-tetraglycidyl bisaminomethyl cyclohexane. Among other epoxy resins cited above, such powdery epoxy resins as bixylenol diglycidyl ether and triglycidyl isocyanurate prove to be desirable from the view points of developability and tack-free touch of finger of the coating film. The cyclocarbonate compounds which are produced from these epoxy resins may be used either singly or in the form of a mixture of two or more members.

The blocked isocyanates mentioned above include oxime blocked products (compounds whose isocyanate groups are blocked with oximes), caprolactam blocked products, and dimethyl amine blocked products of such well-known diisocyanates as tolylene diisocyanate, hexamethylene diisocyanate, isophorone diisocyanate, diphenylmethane diisocyanate, and naphthalene diisocyanate, for example. These blocked isocyanates can be used either singly or in the form of a mixture of two or more members.

As the epoxy resin to be used as a thermosetting component mentioned above, any of such well-known epoxy resins as the epoxy resins of the bisphenol A type, hydrogenated bisphenol A type, bisphenol F type, bisphenol S type, phenol novolak type, cresol novolak type, bisphenol A-based novolak type, biphenol type, and bixylenol type; alicyclic epoxy resins; diglycidyl ethers of polyethylene glycol or polypropylene glycol; and triglycidyl isocyanurate may be used. The epoxy resins may be used either singly or in the form of a mixture of two or more members. Among other epoxy resins cited above, such powdery epoxy resins as triglycidyl isocyanurate prove to be desirable from the view point of developability of the coating film. Further from the viewpoint of their reactivity, solubility, and life of dried coating film, the triglycidyl isocyanurate of the high-melting type having three epoxy groups thereof oriented in one direction relative to the plane of the S-triazine skeleton proves to be particularly preferable among other species of triglycidyl isocyanurate.

The amount of the thermosetting component to be incorporated in the composition is desired to be in the range of from 5 to 40 parts by weight, preferably 10 to 30 parts by weight, based on 100 parts by weight of the photoresist. If the amount of the thermosetting component is less than 5 parts by weight based on 100 parts by weight of the photocurable resin, the characteristic properties such as adhesiveness to the substrate, resistance to soldering temperature, and resistance to chemicals which the cured coating film is expected to manifest will not be easily obtained. Conversely, if this amount exceeds 40 parts by weight, the thermosetting component except for the high-melting epoxy resin will suffer the disadvantage of incurring difficulty in obtaining a tack-free coating film.

The photoresist composition may optionally include a diluents such as water or an organic solvent. Examples of organic solvents include alcohols, e.g., methanol, ethanol, isopropanol, etc.; esters, e.g., ethyl acetate, ethyl lactate, etc.; cyclic ethers, e.g., tetrahydrofuran, dioxane, etc.; ketones, e.g., acetone, methyl ethyl ketone, etc.; alkylene glycol ethers or esters, e.g., ethylene glycol ethyl ether, ethylene glycol ethyl ether acetate, ethylene glycol dimethyl ether, diethylene glycol dimethyl ether, propylene glycol monomethyl ether acetate, etc.; cellosolves, carbitols, cellosolve acetates, carbitol acetates, and aromatic hydrocarbons. Among other organic solvents mentioned above, water-soluble organic solvents prove to be particularly desirable. The amount of the organic solvent to be used is desired to be not more than 50 parts by weight, preferably not more than 30 parts by weight, based on 100 parts by weight of the photoresist described above. Normally the solvent is removed by the application of heat after coating.

The photoresist compositions of the instant disclosure may optionally incorporate therein additionally a photopolymerizable monomer. The photopolymerizable monomers which are usable herein include hydroxyl group-containing acrylates such as 2-hydroxyethyl acrylate, 2-hydroxybutyl acrylate, pentaerythritol triacrylate, and dipentaerythritol pentaacrylate; acrylamide derivatives such as acrylamide and N-methylolacrylamide; water-soluble acrylates such as polyethylene glycol diacrylate and polypropylene glycol diacrylate; acrylates such as trimethylolpropane triacrylate and pentaerythritol tetraacrylate; and methacrylates corresponding to the acrylates mentioned above, for example. These photopolymerizable monomers may be used either singly or in the form of a combination of two or more members. Among other photopolymerizable monomers mentioned above, the hydrophilic group-containing (meth)acrylates prove to be particularly desirable in terms of liquid stability of the composition and the polyfunctional (meth)acrylates prove to be particularly desirable in terms of the photocuring properties. Further, such macromolecular compounds as polyvinyl alcohol, polyacrylamide, carboxymethyl cellulose, polyvinyl formal resin, and polyvinyl acetal resin which are water-soluble resins may be used as a protective colloid. The use of the protective colloid is effective in improving the liquid stability of the composition. Likewise for the purpose of improving the liquid stability of the composition, a surface-active agent may be used. From the viewpoints of electrical insulation properties, resistance to electrolytic corrosion, and liquid stability, the surface-active agent is desired to be of a nonionic type having an HLB (hydrophilic-lipophilic balance) value of not less than 13.

Optionally, such well-known and widely used inorganic fillers as barium sulfate, talc, silica, aluminum oxide, and aluminum hydroxide may be used for the purpose of enhancing the characteristic properties of the composition of the present invention such as adhesiveness to a substrate, hardness, and resistance to soldering temperature of the cured coating film. The amount of the inorganic filler to be used is desired to be in the range of not more than 100 parts by weight, preferably 5 to 50 parts by weight, based on 100 parts by weight of the photoresist composition. Further, well-known and widely used additives such as color pigments, thermopolymerization inhibitors, curing catalysts, thickening agents, anti-foaming agents, leveling agents, and coupling agents may be used, as occasion demands.

PIs

Polymerization or curing of the composition can be accomplished by exposing the composition to energy in the presence of a photoinitiator. These photoinitiators can be employed in concentrations ranging from about 0.0001 to about 3.0 pbw, preferably from about 0.001 to about 1.0 pbw, and more preferably from about 0.005 to about 0.5 pbw, per 100 pbw of the photoresist component.

Useful photoinitiators include those known as useful for photocuring free-radically monomers. Exemplary photoinitiators include benzoin and its derivatives such as alpha-methylbenzoin; alpha-phenylbenzoin; alpha-allylbenzoin; alpha-benzylbenzoin; benzoin ethers such as benzil dimethyl ketal (e.g., "IRGACURE 651" from BASF, Florham Park, N.J.), benzoin methyl ether, benzoin ethyl ether, benzoin n-butyl ether; acetophenone and its derivatives such as 2-hydroxy-2-methyl-1-phenyl-1-propanone (e.g., "DAROCUR 1173" from BASF, Florham Park, N.J.) and 1-hydroxycyclohexyl phenyl ketone (e.g., "IRGACURE 184" from BASF, Florham Park, N.J.); 2-methyl-1-[4-(methylthio)phenyl]-2-(4-morpholinyl)-1-propanone (e.g., "IRGACURE 907" from BASF, Florham Park, N.J.); 2-benzyl-2-(dimethylamino)-1-[4-(4-morpholinyl)phenyl]-1-butanone (e.g., "IRGACURE 369" from BASF, Florham Park, N.J.) and phosphine oxide derivatives such as Ethyl-2,4,6-trimethylbenzoylphenylphoshinate (e.g. "TPO-L" from BASF, Florham Park, N.J.), and Irgacure 819 (phenylbis(2,4,6-trimethylbenzoyl) phosphine oxide) available from BASF, Florham Park, N.J.

Other useful photoinitiators include, for example, pivaloin ethyl ether, anisoin ethyl ether, anthraquinones (e.g., anthraquinone, 2-ethylanthraquinone, 1-chloroanthraquinone, 1,4-dimethylanthraquinone, 1-methoxyanthraquinone, or benzanthraquinone), halomethyltriazines, benzophenone and its derivatives, iodonium salts and sulfonium salts, titanium complexes such as bis(eta$_5$-2,4-cyclopentadien-1-yl)-bis[2,6-difluoro-3-(1H-pyrrol-1-yl) phenyl] titanium (e.g., "CG1 784DC" from BASF, Florham Park, N.J.); halomethyl-nitrobenzenes (e.g., 4-bromomethylnitrobenzene), mono- and bis-acylphosphines (e.g., "IRGACURE 1700", "IRGACURE 1800", "IRGACURE 1850", and "DAROCUR 4265").

The photocurable composition may be irradiated with activating UV or visible radiation to polymerize the components preferably in the wavelengths of 250 to 500 nanometers. UV light sources can be of two types: 1) relatively low light intensity sources such as blacklights that provide generally 10 mW/cm$^2$ or less (as measured in accordance with procedures approved by the United States National Institute of Standards and Technology as, for example, with a UVIMAP™ UM 365 L-S radiometer manufactured by Electronic Instrumentation & Technology, Inc., in Sterling, Va.) over a wavelength range of 280 to 400 nanometers and 2) relatively high light intensity sources such as medium- and high-pressure mercury arc lamps, electrodeless mercury lamps, light emitting diodes, mercury-xenon lamps, lasers, LED UV light sources, and the like, which provide intensities generally between 10 and 5000 mW/cm$^2$ in the wavelength rages of 320-390 nm (as measured in accordance with procedures approved by the United States National Institute of Standards and Technology as, for example, with a PowerPuck™ radiometer manufactured by Electronic Instrumentation & Technology, Inc., in Sterling, Va.).

The photocurable composition is often cured using a phototool to cure only selective portions of the photocurable composition. Phototools are typically made using a computer-aided design (CAD) system to prepare data for an exposure apparatus (for example, a photo-plotter) based on a target blueprint or data. Then, this data is used to perform direct writing of a designed pattern (for example, a circuit pattern) onto an emulsion photographic dry plate, which has been prepared by forming a film surface of a photosensitive emulsion layer on an optically clear substrate (for example, a glass substrate, fused silica or polyethylene terephthalate (PET), polycarbonate, or polymethylmethacrylate substrate). Optically clear substrates typically have low haze (for example, less than about 5% or even less than about 2%) and are substantially transparent (that is, they typically allow the passage of 95% or more (preferably 98% or more) of visible and ultraviolet light.

The photographic dry plate with the pattern thereon is then developed, fixed, washed in water, and dried. It may then be examined for defects and, if necessary, retouched. The photosensitive emulsion layer typically comprises a silver halide emulsion or a diazo emulsion. Thus, the film surface is relatively soft and easily scratched or marked, correspondingly, special care is needed to prevent any scratching. Chrome metal absorbing film may also be used.

If desired, the phototool may further comprise a release coating to further improve the release properties from photoresist comprising both cured and uncured parts to avoid or reduce any possible damage and reduce contamination, in addition to a durable protective hard coating to improve scratch and abrasion resistance. Thus the phototool may further comprise a coating such as that described in U.S. 2010/048751 (Qiu, incorporated by reference) comprising an epoxy silane and an oligomer of the formula $M^F M^E M^S$, where $M^F$ is a fluorinated (meth)acrylate, $M^E$ comprises an epoxy (meth)acrylate and $M^S$ comprises a silane (meth)acrylate. Alternatively the phototool can comprise a such as that described in US2010/048757 (Qiu, incorporated by reference) comprising an epoxy silane and an oligomer of the formula $M^F M^E M^A$, where $M^F$ is a fluorinated (meth)acrylate, $M^E$ comprises an epoxy (meth)acrylate and $M^A$ comprises a (meth)acrylate. Alternatively The phototool may comprise a hardcoat such as described in Applicant's copending U.S. Ser. No. 61/549,138, filed 19 Oct. 2011 (Qiu) comprising (a) an epoxy silane compound, (b) a reactive silicone additive, and (c) photo-acid generator. The reactive silicone additive has one of the following general structures:

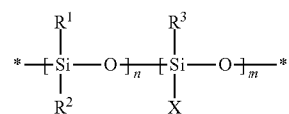

or

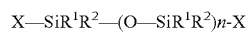

wherein:
$R^1$, $R^2$, and $R^3$ are independently a $C_1$-$C_6$ alkyl group or aromatic group with or without substitution;
X is a curable group selected from —OH, —OR, —OC(O)R, —OSiY$^1$Y$^2$Y$^3$, —CH$_2$CH$_2$-L-SiY$^1$Y$^2$Y$^3$ and R$_3$CO—, wherein R is a $C_1$-$C_4$ alkyl group, L is a divalent linkage group and Y$^1$, Y$^2$ and Y$^3$ are independently selected from $C_1$-$C_6$ alkyl groups and OR, and at least one Y is a curable group selected —OH, —OC(O)R and —OR, and n is at least 2 and in is at least 1 provided that the weight average molecular weight ($M_w$) of the reactive silicone additive is no more than about 4200.

The photocurable coating composition may be combined with a diluent to a viscosity suitable for a selected method of coating and applied to a substrate by such a method as the spray coating, curtain coating, screen printing, or roll coating. The applied layer of the composition may be dried to evaporate the diluent contained in the composition and to obtain a coating film having reduced tack. The spray coating method and the curtain coating method can be advantageously used particularly among other methods of coating. Desirably the coated photocurable composition is exposed to heat to evaporate the solvent and partially cure the composition, in embodiments comprising a thermosetting component.

A photomask or phototool may be affixed to the coated photocurable composition, typically by vacuum lamination. The coated photocurable composition is selectively exposed to an actinic radiation, such as UV radiation, through a phototool having a prescribed pattern formed therein. Examples of light sources which are advantageously used for the purpose of photocuring the composition include low-pressure mercury lamp, medium-pressure mercury lamp, high-pressure mercury lamp, ultra-high-pressure mercury lamp, xenon lamp, and metal halide lamp, for example. The laser beam may be utilized as the actinic radiation for exposure of the coating film. Besides them, electron beam, alpha rays, beta rays, gamma rays, X-rays, and neutron rays are likewise usable.

After exposure, the phototool may be removed from the pattern-transferred coating comprising both cured and uncured photoresist without any damage for repeated use. With the photocurable compositions of this disclosure, the phototool may be cleanly and easily removed from the exposed photocurable composition layer, even from the hardest solder resists.

The selectively pattern-cured coating is developed with a suitable developer. For negative resist compositions the developer removes the unexposed regions. For positive resist composition the developer removes exposed regions. For solder masks, the developed coating may be subject to an additional heating and/or UV exposure step to fully cure the coating. If the photoresist composition further comprises a thermoset resin, the resist film is subsequently thermally cured by being heated to a temperature in the range of from 140 to 180° C., for example, to further crosslink the thermosetting component.

As a result, the photocurable composition excels in such properties as adhesiveness to the substrate, hardness, resistance to soldering temperature, resistance to chemicals, electrical insulating properties, and resistance to electrolytic corrosion which are expected of a resist, and which may be cleanly removed from a phototool after exposure, can be obtained.

EXAMPLES

Materials

Materials utilized are shown in Table 1.

TABLE 1

Materials List

| Material | Description | Source |
|---|---|---|
| HFPOMAr | $C_3F_7O(CF(CF_3)CF_2O)_nCF(CF_3)C(O)NHC_2H_4 OC(O)C(CH_3)=CH_2$, $M_w$~1344 | 3M Company, prepared as described in U.S. Pat. No. 7,094,829 |
| GMA | Glycidyl methacrylate | Sigma-Aldrich, St. Louis, MO |
| MeO-PEGMAr | $CH_3O-(C_2H_4O)_n-C(O)CMe=CH_2$ $M_w$~1100 | Sigma-Aldrich, St. Louis, MO |
| HO-PEGMAr | Poly(ethylene glycol) methacrylate Mw = ~360 | Sigma-Aldrich, St. Louis, MO |
| IEM | 2-Isocyanatoethyl methacrylate, $OCNC_2H_4OC(O)CMe=CH_2$ | Sigma-Aldrich, St. Louis, MO |
| A-189 | SILQUEST A-189, $HSC_3H_6Si(OMe)_3$ | Crompton OSi Specialties, Lisle, IL |
| 2-Mercaptoethanol | $HSCH_2CH_2OH$ | Sigma-Aldrich. St. Louis, MO |
| EP-36 | EBECRYL P 36, acrylated benzophenone derivative | Cytec Industries Inc., Woodland Park, NJ |
| Silicone-MA | Monomethacryloxypropyl terminated polydimethylsiloxane MW~800-1000 | Gelest, Inc., Morrisville, PA |
| Vazo 67 | 2,2'-Azobis(2-methylpropionitrile) | DuPont, Wilmington, DE |
| MA-100 | Polyethyleneglycol monomethacrylate Mw~540 | Kowa America, New York, NY |
| IPS | $OCN(CH_2)_3Si(OMe)3$ | Sigma-Aldrich, St. Louis, MO |
| DBTDL | Diburyl tin dilaurate | Sigma-Aldrich, St. Louis, MO |
| FA-1 | FC-4430, acrylate oligomer | 3M Company, St. Paul, MN |
| FA-2 | FC-4431, acrylate oligomer | 3M Company, St. Paul, MN |
| FA-3 | FC-4432, acrylate oligomer | 3M Company, St. Paul, MN |
| $CBr_4$ | Tetrabromomethane | Sigma-Aldrich, St. Louis, MO |

Test Methods

Release

A 2.54 cm wide strip of Scotch 610 cellophane tape (3M Company, St. Paul, Minn.) was laminated to the sample coatings with two passes of a 2 kg rubber roller. An Imas SP2000 (IMASS Inc., Accord, Mass.) was utilized to peel the tape at an angle of 180 degrees and a speed of 2.3 m/min for 5 seconds. Peel force was measured. Tests were performed at 21° C. and 50% RH. Typically, 3 measurements were made from different locations and the mean reported Re-Adhesion The tape strips utilized in the Release test were peeled and laminated to a clean stainless steel panel with two passes of a 2 kg rubber roller. An Imass™ SP2000 was used to peel the tape at an angle of 180 degrees and a speed of 30 cm/min for 10 seconds. Peel force was measured. Tests were performed at 21° C. and 50% RH. Typically, 3 measurements were made from different locations and the mean reported.

Contact Angle

Advancing, receding, and static contact angles were measured with a Krus™ DSA 100 (Cruss GmbH, Hamburg, Germany). Measurements were made using reagent-grade hexadecane and deionized water, on a video contact angle system analyzer (VCA-2500XE, AST Products, Billerica, Mass.). Reported values are the averages of measurements on at least three drops measured on the right and the left sides of the drops. Drop volumes were 5 microliters for static contact angle measurements and 1-3 microliters for advancing and receding contact angle measurements.

Fluorochemical Acrylate Polymers

FA-1 through FA-3

FA-1 through FA-3 are commercially available through 3M Company.

FA-4

FA-4 (HFPOMAr/GMA, 10/90) was prepared as described in US patent application publication 2011/0027702 (see FA-1 preparation, paragraph 0141.

FA-5 through FA-18

FA-5 through FA-18 were prepared as described in FA-4 with the compositions shown in Table 2.

FA-19

FA-19 was prepared as described in FA-4. In a 4 oz bottle with a magnetic stir bar was added 4 g HFPO-MAr, 6 g HO-PEO-MAr, 0.1 g A-189, 0.29 g Vazo 67, and 40 g ethyl acetate. The solution was bubbled with nitrogen for one minute, then sealed and polymerized at 70° C. for 24 hours with stirring. A clear homogeneous solution was obtained.

FA-20

In a 4 oz bottle with a stir bar was added 4.0 g of HFPO-MAr (Mw ~1344, 3 mmol), 6.0 g of HO-PEO-MAr (Mn ~360, 16.67 mmol), 0.3 g of $HSCH_2CH_2OH$, 0.25 g of Vazo 67, and 40 g of ethyl acetate. The solution was bubbled with nitrogen for one minute. The bottle was sealed and the solution was polymerized at 70° C. for 24 hours under constant stirring. A clear homogeneous solution was obtained. When cooled to room temperature, 2.5 of IEM (Mw=155, 16.13 mmol) and 0.11 of dibutyl tin dilaurate were added. The resulting solution was then stirred at 70° C. for an additional 2 hours, yielding a clear solution at 25% solids.

FA-21 through FA-25

F-21 through F-24 were prepared as described for F-20, with the compositions shown in Table 2.

TABLE 2

Fluorochemical Acrylate Polymers

| FA | Monomers | Chain Transfer |
|---|---|---|
| FA-4 | HFPOMAr/GMA (10/90) | 0.26% $CBr_4$ |
| FA-5 | HFPOMAr/GMA (20/80) | 0.25% $CBr_4$ |
| FA-6 | HFPOMAr/GMA (30/70) | 0.27% $CBr_4$ |
| FA-7 | HFPOMAr/GMA (40/60) | 0.35% $CBr_4$ |
| FA-8 | HFPOMAr/MeOPEGMAr-1100/GMA (40/20/40) | 1% A189 |
| FA-9 | HFPOMAr/MeOPEGMAr-1100 (30/70) | 4% A-189 |
| FA-10 | HFPOMAr/MeOPEGMAr-1100 (35/65) | 4% A-189 |
| FA-11 | HFPOMAr/MeOPEGMAr-1100 (40/60) | 4% A-189 |
| FA-12 | HFPOMAr/MeOPEGMAr-1100/A174 (40/40/20) | 4% A-189 |
| FA-13 | HFPOMAr/MeOPEGMAr-1100/A174 (40/20/40) | 2% A189 |
| FA-14 | HFPOMAr/MeOPEGMAr-350/A174 (40/20/40) | 10% A189 |
| FA-15 | HFPOMAr/MeOPEGMAr-350/A174 (40/20/40) | 5% A189 |
| FA-16 | HFPOMAr/MeOPEGMAr-350/A174 (40/20/40) | 1% A189 |
| FA-17 | HFPOMAr/MeOPEGMAr-350/A174 (40/30/30) | 5% A189 |
| FA-18 | HFPOMA/MeOPEGMAr-1100/A174/EP-36 (40/20/38/2) | 1% A189 |
| FA-19 | HFPOMAr/HOPEG-MAr-360 (40/60) | 1% A-189 |
| FA-20 | HFPOMAr/IEM-HOPEG-MAr-360 (40/60) | 3% $HS(CH_2)_2OH$ |
| FA-21 | HFPOMAr/HO-PEGMAr-360/Silicone-Mar/IEM (40/40/20/17) | 5% A-189 |
| FA-22 | HFPOMAr/HO-PEGMAr-360/Silicone-Mar/IEM (40/20/40/8.6) | 5% A-189 |
| FA-23 | HFPOMAr/MA-100/IPS (40/60/20) | 5% A189 |
| FA-24 | HFPOMAr/HO-PEGMAr-360/IPS (40/60/30) | 5% A189 |

Control

AUS 308 Solder Mask (Control 1)

An ink composition was prepared according to "Taiyo PSR-4000 AUS303" Technical Data Sheet, copyright 2005. Briefly, PSR-4000 AUS 308 was supplied in a pre-measured container with a mix ratio by weight of 70 parts PSR-4000 AUS.308 and 30 parts CA-40 AUS 308. This mixture was mixed by hand with a spatula for 10-15 minutes, and coated on primed PET with a #30 wire rod. The coated PET was dried at 80° C. for 20 minutes, and then placed on a conveyer belt coupled to a ultraviolet ("UV") light curing device and UV cured under nitrogen using a Fusion 500 watt H bulb at 30 ft/min.

AUS 303 Solder Mask (Control 2)

Control-2 was prepared in a similar fashion utilizing PSR-4000 AUS 303 and CA-40 AUS 303.

EXAMPLES

E-1

FA-8 was mixed into AUS 308 Solder Mask at 1% (w/w) by hand with a spatula for 10 minutes, and coated on primed PET with a #30 wire rod. The coated PET was dried at 80° C. for 20 minutes, and irradiated with an H-bulb UV under nitrogen.

E-2 through E-31

Other Examples were prepared as described in E-1 with Additives and Solder Masks shown in the tables below.

Comparatives

Comparatives C-1 through C-7 were prepared as in E-1, with the additives shown in the tables below.

Results

Release and contact angles for PET coated with solder masks mixed with Example and Comparative additives are shown in Tables 3 and 4.

TABLE 3

Epoxy-HFPO Additives Mixed with AUS308 Solder Mask

| Sample | Additive (1% wt) | Release (g/in) | Re-adhesion (g/in) |
|---|---|---|---|
| Control-1 | None | 660.0 | 417.8 |
| E-1 | FA-8 | 31.8 | 423.9 |
| C-1 | FA-4 | 720.3 | 410.1 |
| C-2 | FA-5 | 672.7 | 385.8 |
| C-3 | FA-6 | 657.9 | 374.0 |
| C-4 | FA-7 | 689.7 | 380.6 |

TABLE 4

Epoxy-HFPO Additives Mixed with AUS308 Solder Mask

| | H2O | | | | | | Hexadecane | | | | | |
|---|---|---|---|---|---|---|---|---|---|---|---|---|
| | Advancing | | Receding | | Static | | Advancing | | Receding | | Static | |
| Sample | Left | Right | Left | Right | Left | Right | Left | Right | Left | Right | Left | Right |
| Control-1 | 99.4 | 99.4 | 45.6 | 45.4 | 91.5 | 91.6 | 11.9 | 12.1 | 4.2 | 4.3 | 8.7 | 8.5 |
| E-1 | 110.6 | 110.4 | 55.2 | 55.6 | 100.2 | 100.3 | 67.7 | 67.3 | 44.4 | 44.5 | 65.4 | 65.5 |
| C-1 | 90.6 | 90.5 | 48.3 | 48.6 | 87.5 | 87.4 | 20.4 | 20.3 | 5.5 | 5.7 | 18.6 | 18.7 |
| C-2 | 96.3 | 96.5 | 45.8 | 48.6 | 91.3 | 91.6 | 20.6 | 20.6 | 7.3 | 7.4 | 17.5 | 17.5 |
| C-3 | 94.5 | 94.6 | 41.4 | 41.7 | 88.4 | 88.2 | 31.3 | 31.5 | 12.4 | 12.6 | 29.4 | 29.6 |
| C-4 | 98.6 | 98.5 | 46.5 | 46.3 | 93.6 | 93.6 | 36.5 | 36.6 | 12.4 | 12.6 | 33.6 | 33.6 |

TABLE 5

Silicone-PEG Additives mixed with AUS308 Solder Mask

| Sample | Additive (1% wt) | Release (g/in) | Re-adhesion (g/in) |
|---|---|---|---|
| Control-1 | None | 660.0 | 417.8 |
| E-2 | FA-9 | 389.3 | 354.5 |
| E-3 | FA-10 | 370.7 | 358.2 |
| E-4 | FA-11 | 347.0 | 368.0 |
| E-5 | FA-12 | 207.4 | 329.0 |
| E-6 | FA-13 | 16.5 | 484.1 |
| E-7 | FA-14 | 36.5 | 381.7 |
| E-8 | FA-15 | 16.3 | 467.6 |
| E-9 | FA-16 | 12.5 | 453.2 |
| E-10 | FA-17 | 13.4 | 405.3 |
| C-5 | FA-1 | 523.6 | 343.2 |
| C-6 | FA-2 | 196.6 | 335.5 |
| C-7 | FA-3 | 347.2 | 333.7 |

TABLE 6

Silicone-PEG Additives mixed with AUS308 Solder Mask

| | $H_2O$ | | | | | | Hexadecane | | | | | |
|---|---|---|---|---|---|---|---|---|---|---|---|---|
| | Advancing | | Receding | | Static | | Advancing | | Receding | | Static | |
| Sample | Left | Right | Left | Right | Left | Right | Left | Right | Left | Right | Left | Right |
| Control-1 | 99.4 | 99.4 | 45.6 | 45.4 | 91.5 | 91.6 | 11.9 | 12.1 | 4.2 | 4.3 | 8.7 | 8.5 |
| E-2 | 97.5 | 97.7 | 47.3 | 47.7 | 88.7 | 88.7 | 48.3 | 48.6 | 22.5 | 22.6 | 46.3 | 46.5 |
| E-3 | 100.6 | 100.6 | 49.5 | 49.5 | 93.6 | 93.6 | 51.6 | 51.4 | 25.6 | 25.9 | 47.3 | 47.5 |
| E-4 | 101.2 | 101.3 | 50.2 | 50.8 | 93.5 | 93.5 | 50.4 | 50.3 | 28.5 | 28.7 | 45.6 | 45.6 |
| E-5 | 100.6 | 100.4 | 58.5 | 58.6 | 94.1 | 94.2 | 55.5 | 55.4 | 34.5 | 34.5 | 52.1 | 52.3 |
| E-7 | 117.4 | 117.1 | 67.4 | 67.6 | 107.6 | 107.7 | 78.2 | 78.7 | 58.3 | 58.3 | 74.3 | 74.7 |
| E-8 | 112.6 | 112.6 | 67.3 | 67.5 | 100.5 | 100.2 | 73.4 | 73.2 | 55.6 | 55.6 | 71.5 | 71.5 |
| E-9 | 118.7 | 118.7 | 74.3 | 74.5 | 107.5 | 107.2 | 75.8 | 75.4 | 61.2 | 61.2 | 74.6 | 74.7 |
| E-10 | 112.5 | 112.6 | 77.6 | 77.5 | 107.5 | 107.7 | 70.3 | 70.2 | 55.2 | 55.4 | 68.6 | 68.2 |

Selected additives in from Tables 5 and 6 were tested with the AUS303 solder mask. Results are shown in Tables 7 and 8.

TABLE 7

Silicone-PEG Additives mixed with AUS303 Solder Mask

| Sample | Additive (1% wt) | Release (g/in) | Re-adhesion (g/in) |
|---|---|---|---|
| Control-2 | None | 806.4 | 434.9 |
| E-11 | FA-10 | 30.0 | 429.9 |
| E-12 | FA-13 | 10.5 | 477.6 |
| E-13 | FA-15 | 11.6 | 471.7 |
| E-14 | FA-17 | 10.9 | 482.7 |

TABLE 8

Silicone-PEG Additives mixed with AUS303 Solder Mask

| Sample | H2O Advancing Left | Right | Receding Left | Right | Static Left | Right | Hexadecane Advancing Left | Right | Receding Left | Right | Static Left | Right |
|---|---|---|---|---|---|---|---|---|---|---|---|---|
| Control-2 | 86.7 | 86.7 | 36.6 | 36.2 | 78.1 | 78.4 | 12.3 | 12.5 | —[a] | — | 10.6 | 10.6 |
| E-11 | 115.6 | 115.6 | 45.3 | 45.3 | 108.3 | 108.4 | 64.4 | 64.3 | 44.3 | 44.4 | 62.4 | 62.6 |
| E-12 | 119.3 | 119.5 | 66.1 | 66.7 | 114.5 | 114.6 | 68.4 | 68.5 | 55.7 | 55.2 | 66.4 | 66.4 |
| E-13 | 118.5 | 118.8 | 61.5 | 61.5 | 109.3 | 109.6 | 66.3 | 66.4 | 53.5 | 53.2 | 64.6 | 64.7 |
| E-14 | 120.5 | 120.5 | 71.4 | 71.6 | 116.3 | 116.2 | 75.7 | 75.3 | 62.6 | 62.4 | 71.7 | 71.6 |

[a]not tested

Additional HFPO-PEG additives with different functionalities were also examined. Results are shown in Tabled 9 and 10.

TABLE 9

HFPO-PEG Additives mixed with AUS308 Solder Mask

| Sample | Additive (1 wt. %) | Release (g/in) | Re-adhesion (g/in) |
|---|---|---|---|
| Control-1 | None | 660.0 | 417.8 |
| E-15 | FA-18 | 29.9 | 433.3 |
| E-16 | FA-20 | 17.8 | 471.4 |
| E-17 | FA-22 | 26.1 | 489.3 |
| Control-2 | None | 806.4 | 434.9 |
| E-18 | FA-18 | 24.1 | 418.7 |
| E-19 | FA-19 | 20.7 | 456.6 |
| E-20 | FA-20 | 25.1 | 477.7 |
| E-21 | FA-21 | 80.4 | 538.1 |
| E-22 | FA-22 | 27.9 | 505.3 |
| E-23 | FA-23 | 36.9 | 440.9 |
| E-24 | FA-24 | 37.0 | 428.0 |

TABLE 10

HFPO-PEG Additives mixed with AUS308 Solder Mask

| Sample | H2O Advancing Left | Right | Receding Left | Right | Static Left | Right | Hexadecane Advancing Left | Right | Receding Left | Right | Static Left | Right |
|---|---|---|---|---|---|---|---|---|---|---|---|---|
| Control-2 | 86.7 | 86.7 | 36.6 | 36.2 | 78.1 | 78.4 | 12.3 | 12.5 | —[a] | — | 10.6 | 10.6 |
| E-18 | 118.7 | 118.3 | 71.5 | 71.5 | 113.5 | 113.6 | 74.9 | 74.6 | 57.6 | 57.4 | 71.7 | 71.8 |
| E-19 | 117.5 | 117.4 | 61.5 | 61.5 | 113.6 | 113.7 | 68.4 | 68.6 | 45.3 | 45.4 | 66.7 | 66.5 |
| E-20 | 115.3 | 115.3 | 61.5 | 61.7 | 111.7 | 111.5 | 70.8 | 70.8 | 57.6 | 57.8 | 68.5 | 68.4 |
| E-21 | 116.4 | 116.2 | 71.6 | 71.5 | 112.4 | 112.4 | 63.3 | 63.3 | 48.1 | 48.1 | 62.5 | 62.4 |
| E-22 | 112.3 | 112.7 | 68.4 | 68.2 | 106.7 | 106.4 | 58.2 | 58.5 | 36.2 | 36.7 | 56.6 | 56.4 |
| E-23 | 107.7 | 107.4 | 55.8 | 55.6 | 100.5 | 100.5 | 66.3 | 66.4 | 46.6 | 46.5 | 62.7 | 62.8 |
| E-24 | 101.5 | 101.5 | 55.7 | 55.6 | 96.3 | 96.5 | 62.4 | 62.8 | 41.6 | 41.8 | 61.1 | 61.6 |

[a]not tested

The durability of several representative Example coatings was evaluated by performing the Release test with three fresh pieces of Scotch 610 cellophane tape on the same location of the coated and cured PET film. As shown in Table 11, the release values increase, but the release of the third tape strip remains well below that of the control.

TABLE 11

Durability of AUS303 Solder Mask with HFPO-PEG Additives

| Exp. No# | Additive (1% wt) | Durability (g/in) Release | Re-adhesion |
|---|---|---|---|
| Control-2 | None | 746.6 | 424.1 |
| | | 808.0 | 428.0 |
| | | 864.6 | 452.5 |
| E-25 | FA-8 | 30.9 | 422.0 |
| | | 38.3 | 420.7 |
| | | 31.5 | 429.5 |
| E-13 | FA-15 | 14.7 | 468.7 |
| | | 37.8 | 470.2 |
| | | 140.0 | 534.1 |
| E-18 | FA-18 | 24.0 | 414.9 |
| | | 20.2 | 454.1 |
| | | 33.8 | 443.2 |
| E-22 | FA-22 | 28.2 | 491.7 |
| | | 28.6 | 492.2 |
| | | 104.6 | 484.0 |

The effect of additive concentration in the AUS303 solder mask was investigated with the results shown in Tables 12 and 13.

TABLE 12

Durability of AUS303 Solder Mask with HFPO-PEG Additives

| Sample | Additive (concentration) | Release (g/in) | Re-adhesion (g/in) |
|---|---|---|---|
| Control-2 | None | 837.3 | 430.7 |
| E-26 | FA-13, 0.5% | 33.3 | 429.9 |

TABLE 12-continued

Durability of AUS303 Solder Mask with HFPO-PEG Additives

| Sample | Additive (concentration) | Release (g/in) | Re-adhesion (g/in) |
|---|---|---|---|
| E-27 | FA-13, 0.25% | 63.2 | 413.8 |
| E-28 | FA-13, 0.1% | 257.5 | 392.4 |
| E-29 | FA-17, 0.5% | 21.2 | 475.2 |
| E-30 | FA-17, 0.25% | 61.1 | 428.5 |
| E-31 | FA-17, 0.1% | 71.9 | 410.8 |

TABLE 13

Durability of AUS303 Solder Mask with HFPO-PEG Additives

| | H2O | | | | | | Hexadecane | | | | | |
|---|---|---|---|---|---|---|---|---|---|---|---|---|
| | Advancing | | Receding | | Static | | Advancing | | Receding | | Static | |
| Sample | Left | Right | Left | Right | Left | Right | Left | Right | Left | Right | Left | Right |
| Control-2 | 97.3 | 97.3 | 43.1 | 43.3 | 93.3 | 93.8 | 11.6 | 11.4 | —[a] | — | 8.2 | 8.4 |
| E-26 | 116.8 | 116.3 | 69.2 | 69.4 | 107.6 | 107.4 | 66.7 | 66.4 | 48.4 | 48.3 | 62.3 | 62.3 |
| E-27 | 113.6 | 113.3 | 66.6 | 66.7 | 104.5 | 104.3 | 63.4 | 63.3 | 42.7 | 42.6 | 61.2 | 61.6 |
| E-28 | 108.3 | 108.4 | 56.4 | 56.5 | 101.5 | 101.5 | 45.4 | 45.4 | 22.6 | 22.8 | 41.5 | 41.5 |
| E-29 | 113.4 | 113.1 | 63.3 | 63.4 | 107.6 | 107.4 | 65.7 | 65.8 | 43.4 | 43.5 | 63.2 | 63.4 |
| E-30 | 110.6 | 110.7 | 59.3 | 59.4 | 103.7 | 103.5 | 63.0 | 63.5 | 44.3 | 44.4 | 61.5 | 61.4 |
| E-31 | 108.4 | 108.8 | 55.7 | 55.5 | 100.2 | 100.2 | 57.6 | 57.4 | 39.1 | 39.1 | 55.6 | 55.4 |

[a]not tested

What is claimed is:

1. A photocurable composition comprising:
   a) a photoresist component, and
   b) a copolymer of the formula:

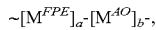
   ~[M$^{FPE}$]$_a$-[M$^{AO}$]$_b$-, where
   [M$^{FPE}$] represents interpolymerized (meth)acryloyl monomer units having a pendent perfluoropolyether group, the perfluoropolyether group having a molecular weight of at least 792 g/mole,
   [M$^{AO}$] represents interpolymerized (meth)acryloyl monomer units having a pendent poly(alkylene oxide) group,
   subscripts a and b are each 1 to 100 and a+b is at least 3, and
   c) a photoinitiator.

2. The photocurable composition of claim 1, wherein the average molecular weight, M$_w$, of the copolymer is from 1500 to 50,000.

3. The photocurable composition of claim 1, wherein said copolymer further comprises epoxy monomer units, [M$^{Epoxy}$]$_c$, and c is at least one.

4. The photocurable composition of claim 3, wherein the epoxy monomers are of the formula:

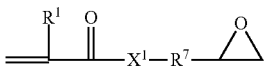

wherein:
R$^7$ is a (hetero)hydrocarbyl group, preferably a hydrocarbyl group, more preferably a C$_1$-C$_6$ alkylene;
R$^1$ is —H or C$_1$-C$_4$ alkyl; and
X$^1$ is —NR$^1$— or —O—.

5. The photocurable composition of claim 1, wherein said copolymer further comprises monomer units of the formula:
[M$^{Sil}$]$_d$, where [M$^{Sil}$] represents interpolymerized (meth)acryloyl monomer units having a pendent silyl group, and d is at least 1.

6. The photocurable composition of claim 1, wherein said copolymer further comprises polymerized hydroxyl functional monomer units [M$^{OH}$] of the formula:

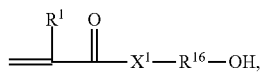

where
R$^{16}$ is a (hetero)hydrocarbyl group;
R$^1$ is —H or C$_1$-C$_4$ alkyl; and
X$^1$ is —NR$^1$— or —O—.

7. The photocurable composition of claim 1, wherein said copolymer further comprises monomer units of the formula:
[M$^{Acryl}$]$_f$, where [M$^{Acryl}$] represents interpolymerized (meth)acryloyl monomer units having a pendent (meth) acrylate groups and f is at least 1.

8. The photocurable composition of claim 1, wherein said copolymer further comprises monomer units of the formula:
[M$^{Ester}$]g, where [M$^{Ester}$] represents interpolymerized (meth)acryloyl monomer units having a pendent ester group and g is at least 1.

9. The photocurable composition of claim 1, wherein said copolymer further comprises monomer units of the formula:
[M$^{PI}$]$_g$, where [M$^{PI}$] represents interpolymerized (meth) acryloyl monomer units having a pendent photoinitiator group and g is at least 1.

10. The photocurable composition of claim 1, comprising 0.1 to 5 parts by weight of the copolymer relative to 100 parts by weight of the photoresist component.

11. The photocurable composition of claim 1 wherein the photoresist component is a positive photoresist.

12. The photocurable composition of claim 1 wherein the photoresist component is a negative photoresist.

13. The photocurable composition of claim 1 wherein the photoresist component is a solder resist.

14. The photocurable composition of claim 1, wherein the poly(alkylene oxide) group of the [M$^{AO}$] monomer units are of formula:

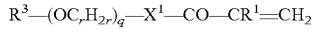
R$^3$—(OC$_r$H$_{2r}$)$_q$—X$^1$—CO—CR$^1$=CH$_2$ wherein
$R^3$ is H, a $C_1$-$C_4$ alkyl group;
r is from 2 to 4;
q is from 4 to 250; and
each $X^1$ is independently —O— or —$NR^1$—,
$R^1$ is H or an alkyl group of 1 to 4 carbons.

15. The photocurable composition of claim 1 further comprising a thermoset resin in the amount from 5 to 40 parts by weight, based on 100 parts by weight of the photoresist component.

16. The photocurable composition of claim 1, wherein the [$M^{FPE}$] monomers are of the formula:
PFE-$X^2$—CO—C($R^1$)=$CH_2$, wherein PFE is a perfluorinated polyether group having a molecular weight of at least 792 g/mol, and $X^2$ is a divalent (hetero)hydrocarbyl linking group, and $R^1$ is hydrogen or alkyl of 1 to 4 carbon atoms.

17. The photocurable composition of claim 1, wherein $X^2$ is selected from —$CH_2$O—,
—$CH_2OCH_2CH_2$O—, —$CH_2SCH_2CH_2$O—,
—$CH_2CH_2$O—, —$CH_2CH_2OCH_2CH_2$O—,
—$CH_2CH_2SCH_2CH_2$O—, —C(O)O$CH_2CH_2$O—,
—C(O)$NR^1CH_2CH_2$O—, —C(O)
$NR^1CH_2CH_2SCH_2CH_2$O—, and —C(O)
$NR^1CH_2CH_2OCH_2CH_2$O—.

18. The photocurable composition of claim 16 wherein the perfluorinated polyether group is of the formula:
$R_f^1$—O—($R_f^2$)$_p$—($R_f^3$)$_q$— wherein $R_f^1$ represents a perfluorinated alkyl group, $R_f^2$ represents a $C_1$-$C_4$ perfluorinated polyalkyleneoxy groups or a mixture thereof, $R_f^3$ represents a perfluorinated alkylene group, p is 3 to 25, and q is 0 to 1.

19. The photocurable composition of claim 5, wherein the silyl functional monomer units, [$M^{Sil}$], are of the formula:

A-$R^8$—Si—(Y)$_p$($R^9$)$_{3-p}$ wherein:
A is an (meth)acrylate group;
$R^8$ is a covalent bond or a divalent (hetero)hydrocarbyl group;
Y is a hydrolysable group, including alkoxy, acyloxy and halo;
$R^9$ is a monovalent alkyl or aryl group.

20. The photocurable composition of claim 1 wherein the copolymer comprises:
5 to 60 parts by weight of said [$M^{FPE}$] monomer units,
5 to 80 parts by weight of said -[$M^{AO}$] monomer units,
0 to 50 parts by weight of said [$M^{Sil}$] monomer units,
0 to 40 parts by weight of said [$M^{Epoxy}$] monomer units,
0 to 40 parts by weight of said [$M^{Acryl}$] monomer units,
0 to 40 parts by weight of said [$M^{Ester}$] monomer units,
0 to 5 parts by weight of said [$M^{PI}$] monomer units,
0 to 30 parts by weight of [$M^{OH}$] monomer units,
wherein the sum of said monomer units is 100 parts by weight.

21. The photocurable composition of claim 1, further comprising a thermosetting resin component.

22. The photocurable composition of claim 1 wherein the copolymer is of the formula:

~[$M^{FPE}$]$_a$-[$M^{AO}$]$_b$-[$M^{Epoxy}$]$_c$[$M^{Sil}$]$_d$-[$M^{PI}$]$_e$-[$M^{Acryl}$]$_f$-[$M^{Ester}$]$_g$-[$M^{OH}$]$_h$~ where
[$M^{FPE}$] represents interpolymerized (meth)acryloyl monomer units having a pendent perfluoropolyether group,
[$M^{AO}$] represents interpolymerized (meth)acryloyl monomer units having a pendent poly(alkylene oxide) group,
[$M^{Epoxy}$] represents interpolymerized (meth)acryloyl monomer units having a pendent epoxy group,
[$M^{Sil}$] represents interpolymerized (meth)acryloyl monomer units having a pendent silyl group,
[$M^{PI}$] represents interpolymerized (meth)acryloyl monomer units having a pendent photoinitiator group;
[$M^{Acryl}$] represents interpolymerized (meth)acryloyl monomer units having a pendent polymerizable (meth)acryloyl group;
-[$M^{OH}$]- represents interpolymerized (meth)acryloyl monomer units having a pendent hydroxy group,
subscripts a and b are each 1 to 100 and a+b is at least 3, c, d, e, f, g and h may be zero.

23. A multilayer article comprising
a) a metallic base substrate,
b) a phototool,
c) the photocurable layer of claim 1 disposed therebetween.

24. The multilayer article of claim 23, wherein the photocurable layer has been partially cured by heat and/or light exposure.

25. The multilayer article of claim 23 further comprising a hardcoat disposed on the surface of the phototool.

26. The semi-cured composition of claim 23 having release value less than 100 g/in (~39 g/cm).

27. The photocurable composition of claim 1, wherein the copolymer contains no epoxy monomers units.

* * * * *

UNITED STATES PATENT AND TRADEMARK OFFICE
CERTIFICATE OF CORRECTION

PATENT NO.       : 8,715,904 B2
APPLICATION NO.  : 13/457657
DATED            : May 6, 2014
INVENTOR(S)      : Zai-Ming Qiu It is certified that error appears in the above-identified patent and that said Letters Patent is hereby corrected as shown below:

In the Specification

Column 4,
Line 55, delete "or" and insert -- or-$NR^1$-. --, therefor.

Column 5,
Line 10, delete "(C)" and insert -- (O) --, therefor.

Column 9,
Line 56, delete "bis(isobutyronitrile)," and
insert -- 2,2,-azo-bis(isobutyronitrile), --, therefor.

Column 10,
Lines 4-5, delete "propiophenonc;" and insert -- propiophenone; --, therefor.

In the Claims

Column 27,
Line 45, in Claim 20, delete "comprises:" and insert -- comprises --, therefor.

Signed and Sealed this
Twenty-sixth Day of August, 2014

Michelle K. Lee
*Deputy Director of the United States Patent and Trademark Office*